United States Patent [19]
Ueda et al.

[11] Patent Number: 5,304,456
[45] Date of Patent: Apr. 19, 1994

[54] NEGATIVE PHOTORESIST COMPOSITION

[75] Inventors: Yuji Ueda, Izumi; Hiromi Ueki, Osaka; Naoki Takeyama, Osaka; Takehiro Kusumoto, Takarazuka, all of Japan

[73] Assignee: Sumitomo Chemical Company, Limited, Osaka, Japan

[21] Appl. No.: 827,423

[22] Filed: Jan. 29, 1992

[30] Foreign Application Priority Data

Jan. 31, 1991 [JP] Japan ................... 3-010772
Mar. 29, 1991 [JP] Japan ................... 3-066215
Apr. 12, 1991 [JP] Japan ................... 3-079742
Sep. 26, 1991 [JP] Japan ................... 3-247396

[51] Int. Cl.$^5$ ............... C08L 61/10; C08L 61/28; C08L 61/34; G03F 7/004
[52] U.S. Cl. ................... 430/270; 430/905; 430/914; 430/921; 522/33; 522/109; 522/63; 522/111; 522/166; 525/497; 528/153
[58] Field of Search ............ 430/270, 905, 904, 921; 522/33, 109, 111, 166; 525/497; 528/153

[56] References Cited

U.S. PATENT DOCUMENTS

| | | | |
|---|---|---|---|
| 3,288,864 | 11/1966 | Farnham | 260/619 |
| 3,987,037 | 10/1976 | Bonham et al. | 522/63 |
| 4,189,323 | 2/1980 | Buhr | 430/281 |
| 4,837,128 | 6/1989 | Kawamma et al. | 430/281 |
| 4,929,536 | 5/1990 | Spak et al. | 430/325 |

FOREIGN PATENT DOCUMENTS

| | | |
|---|---|---|
| 0164248 | 5/1985 | European Pat. Off. . |
| 0397460 | 5/1990 | European Pat. Off. . |
| 0436174A3 | 12/1990 | European Pat. Off. . |
| 0436174A2 | 12/1990 | European Pat. Off. . |
| 53-133428 | 11/1978 | Japan . |
| 63-153542 | 6/1988 | Japan . |
| 1-293339 | 11/1989 | Japan . |
| 3-200250 | 9/1991 | Japan . |
| 1388492 | 3/1975 | United Kingdom . |

OTHER PUBLICATIONS

J. Org. Chem., 29, 1527 (1964).
Bul. Chem. Soc., Japan, 42, 2924 (1969).
Journal of Photopolymer Sci. and Tech., vol. 3, No. 3, (1990), 355–373, *Some Resists Based on Chemically-Amplified Crosslinking of Phenolic Polymers*.
Research Disclosure, 2244, No. 149, Sep. 1976.
Chemical Abstracts, vol. 112, No. 2, Abstract No. 14136s (1990).
Chemical Abstracts, vol. 112, No. 6, Abstract No. 45429u (1990).
Patent Abstracts of Japan, vol. 14, No. 330, JP-A-2 120 366 (1990).

*Primary Examiner*—Marion E. McCamish
*Assistant Examiner*—Arthur H. Koeckert
*Attorney, Agent, or Firm*—Birch, Stewart, Kolasch & Birch

[57] ABSTRACT

A negative photoresist composition containing an alkali-soluble resin which is obtainable through a condensation reaction of an aldehyde with a phenol compound containing a compound of the general formula:

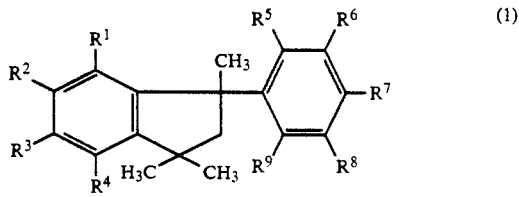

wherein $R^1$ to $R^9$ are independently a hydrogen atom, an alkyl group, an alkenyl group, an alkylcarbonyl group, a halogen atom or a hydroxyl group, provided that at least one of $R^1$ to $R^9$ is a hydroxyl group and, at the ortho- or para-position to the hydroxyl group, at least two hydrogen atoms are present; a cross linking agent; and a photo-acid generator, and a negative photoresist composition comprising an alkali-soluble resin, a cross linking agent and a photo-acid generator having a trifluoromethanesulfonic acid ester group, which can increase resolution and contrast of a photoresist pattern.

21 Claims, No Drawings

NEGATIVE PHOTORESIST COMPOSITION

BACKGROUND OF THE INVENTION

1. Field of the Invention

The present invention relates to a negative photoresist composition which is a pattern-forming material in the production of a semiconductor. More particularly, the present invention relates to a negative photoresist composition which has high sensitivity, high resolution and high resistance to dry etching and is suitable for far ultra-violet or excimer laser lithography.

2. Description of the Related Art

Recently, integrated circuits have been highly miniatuarized; but with the increase of a degree of integration it has become required to form a submicron order pattern. In particular, excimer laser lithography makes it possible to produce next-generation 64 MDRAM and 256 MDRAM. With the change of a light source, a resist should have heat resistance, a good film thickness retention and a profile and also the following properties:

a) Having a high sensitivity to the above light source, and b) Having a high resolution.

Japanese Patent Kokai Publication No. 293339/1989 discloses a composition containing a polymer which comprises hydroxystyrene, a cross linking agent and a photo-acid generator such as p-toluene sulfonates. However, this composition has unsatisfactory sensitivity and resolution, and does not satisfy the above requirements.

SUMMARY OF THE INVENTION

An object of the present invention is to provide a negative photoresist composition which is excellent in sensitivity and resolution while maintaining good resist properties such as heat resistance, a film thickness retention, a coating property, a profile, etc.

According to a first aspect of the present invention, there is provided a negative photoresist composition comprising an alkali-soluble resin obtainable through a condensation reaction of an aldehyde with a phenol compound containing a compound of the general formula:

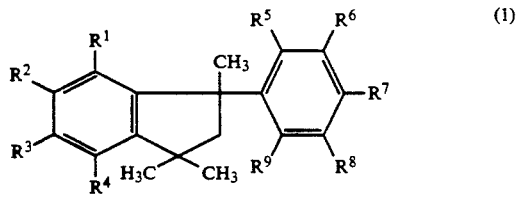

(1)

wherein $R^1$ to $R^9$ are independently a hydrogen atom, a substituted or unsubstituted alkyl group, a substituted or unsubstituted alkenyl group, a substituted or unsubstituted alkylcarbonyl group, a halogen atom or a hydroxyl group, provided that at least one of $R^1$ to $R^9$ is a hydroxyl group and, at the ortho- or para-position to said hydroxyl group, at least two hydrogen atoms are present, a cross linking agent and a photo-acid generator.

According to the second aspect of the present invention, there is provided a negative photoresist composition comprising an alkali-soluble resin, a cross linking agent and a photo-acid generator having a trifluoromethanesulfonic acid ester group.

DETAILED DESCRIPTION OF THE INVENTION

In the negative photoresist of the first aspect of the present invention, the alkali-soluble resin can be obtained through a condensation reaction of an aldehyde with a phenol compound containing a compound of the above general formula (1) in the presence of an acid catalyst.

Specific examples of the aldehyde are formaldehyde, paraformaldehyde, acetaldehyde, propylaldehyde, benzaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, glutaraldehyde, glyoxal, o-methylbenzaldehyde, p-methylbenzaldehyde, etc. Among them formaldehyde is preferred in view of easy availability in an industrial scale. These aldehydes may be used independently or as a mixture of two or more of them.

The addition condensation reaction of the aldehyde with the phenol compound containing the compound (1) can be carried out in a conventional manner, for example, at a temperature of 60° to 120° C. for 2 to 30 hours.

As a catalyst, an organic acid, an inorganic acid or a divalent metal salt is used. Examples of the catalyst are oxalic acid, hydrochloric acid, sulfuric acid, perchloric acid, p-toluenesulfonic acid, trichloroacetic acid, phosphoric acid, formic acid, zinc acetate, magnesium acetate, etc. The reaction may be carried out in the presence or absence of a solvent.

The compound (1) may be prepared from a m- or p-isopropenylphenol or its linear dimer according to the method disclosed in U.S. Pat. No. 3,288,864.

The alkyl group for $R^1$ to $R^9$ may be a straight or branched one and preferably has 1 to 7 carbon atoms. Preferred examples of the alkyl group are a methyl group, an ethyl group, a n-propyl group, an isopropyl group, etc. Examples of the substituent on the alkyl group are a halogen atom and a lower alkylcarbonyl group.

The alkenyl group for $R^1$ to $R^9$ may be a straight or branched one and preferably has 2 to 4 carbon atoms.

The alkylcarbonyl group for $R^1$ to $R^9$ may be a straight or branched one and preferably has 2 to 7 carbon atoms. Preferred examples of the alkylcarbonyl group are an acetyl group, a propionyl group, a butyryl group, an isobutyryl group, etc. Examples of the substituent on the the alkenyl group or the alkylcarbonyl group are halogen atom, an aryl group, etc.

The halogen atom is preferably a fluorine atom, a chlorine atom or a bromine atom.

Preferred examples of the compound (1) are as follows:

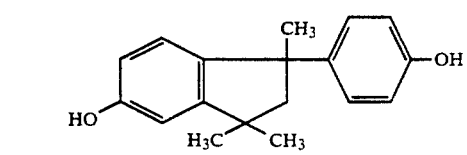

-continued

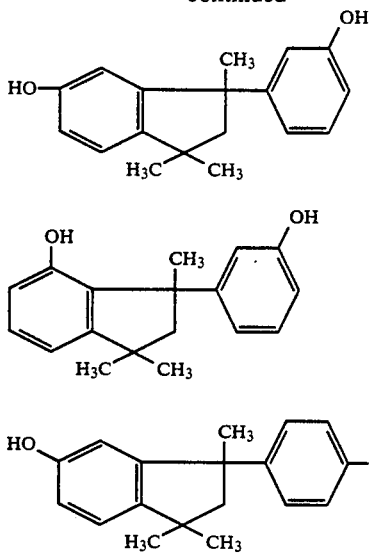

They may be used independently or as a mixture thereof.

In addition to the compound (1), the phenol compound to be reacted with the aldehyde may contain at least one other phenol such as phenol, m-cresol, p-cresol, o-cresol, p-tert.-butylphenol, 2,5-xylenol, 3,5-xylenol, 2,3,5-trimethylphenol, 5-methyl-2-tert.-butylphenol, m-methoxyphenol, isoamylphenol, bisphenol A, etc.

The alkali-soluble resin according to the present invention may be used as such or in combination with at least one other alkali-soluble resin insofar as the effects of the present invention are not deteriorated.

Specific examples of the other alkali-soluble resin are phenol-novolak resin, cresol-novolak resin, xylenol-novolak resin, vinylphenol resin, isopropenylphenol resin, a copolymer of vinylphenol with styrene, acrylonitrile, or methyl methacrylate or acrylate, a copolymer of isopropenylphenol with styrene, acrylonitrile, or methyl methacrylate or acrylate, or these resins or copolymer to which an alkyl group containing silicon is introduced. They may be used independently or as a mixture thereof.

In the negative photoresist composition according to the first aspect of the present invention, the alkali-soluble resin of the present invention has a polystyrene-converted weight average molecular weight ($M_w$) of 1000 to 10,000, preferably 1500 to 8000, more preferably 2000 to 5000, when it is measured by a gel permeation chromatography (GPC).

Specific examples of the cross linking agent to be used according to the present invention are as follows:

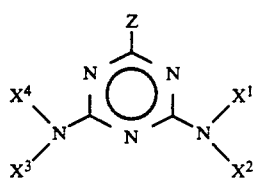

wherein Z is —NRR' or a substituted or unsubstituted aryl group, R, R' and $X^1$ to $X^4$ are independently a hydrogen atom or a group of the formula: —CH$_2$OH or —CH$_2$OR" in which R" is an alkyl group, (9)

(10)

(11)

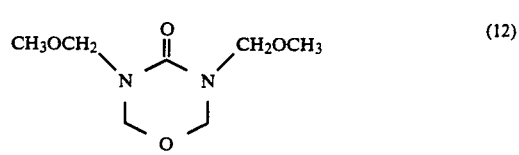

(12)

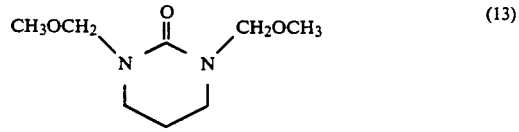

(13)

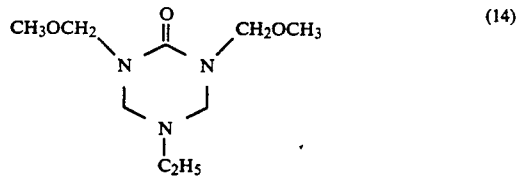

(14)

In the compound (2), a methylol derivative may be prepared by condensing melamine or a benzoguanamine derivative with formaldehyde in an alkaline condition. The compounds (9) and (10) may be prepared by condensing cresol and 4-tert.-butylphenol, respectively with formaldehyde in an alkaline condition. The compounds (11) to (14) are disclosed in Japanese Patent Kokai Publication No. 293339/1989.

Among them, the compound (2) is preferred.

Examples of the aryl group for Z in the compound (2) are a phenyl group, a 1-naphthyl group, a 2-naphthyl group, etc., Examples of the substituent are an alkyl group, an alkoxyl group, a nitro group, a halogen atom, etc. The alkyl group for R" is preferably a straight or branched $C_1$-$C_4$ alkyl group, in particular, a methyl group or an ethyl group.

Specific examples of the compound (2) are

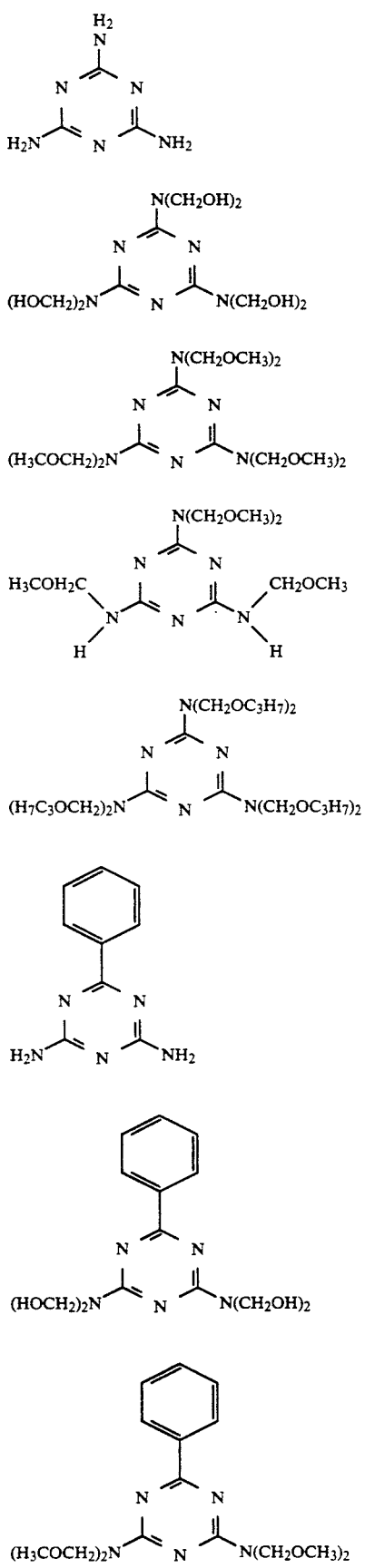

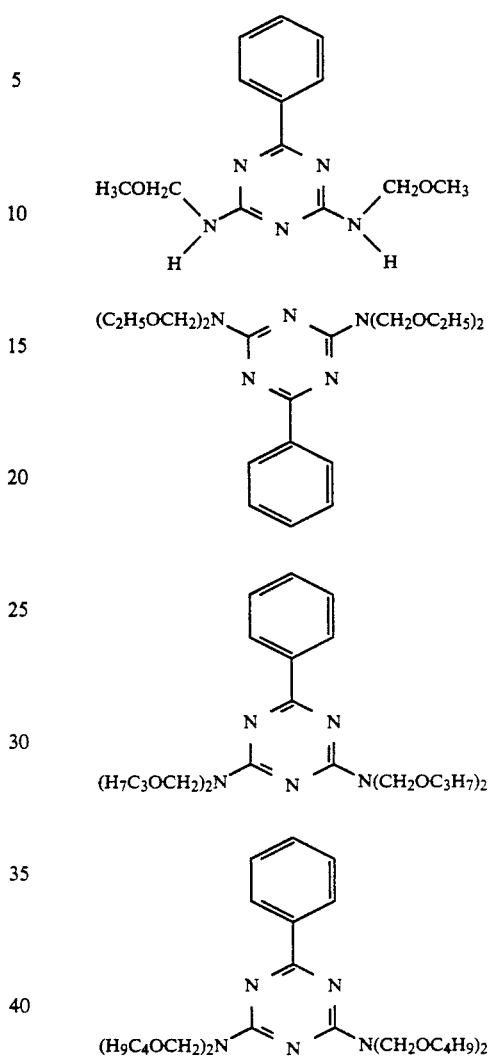

The cross linking agent to be used in the present invention is not limited to the above exemplified compounds, and their analogues or derivatives may be used.

These cross linking agents may be used independently or as a mixture of two or more of them.

Examples of the photo-acid generator to be used in the negative photoresist composition according to the first aspect of the present invention are the following compounds (3) and (4):

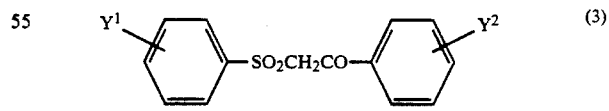

wherein $Y^1$ and $Y^2$ are independently a hydrogen atom, an alkyl group, an alkenyl group or an alkoxyl group,

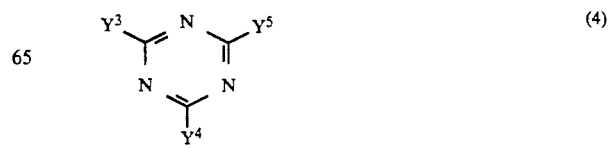

wherein $Y^3$, $Y^4$ and $Y^5$ are independently a substituted or unsubstituted alkyl group, a substituted or unsubstituted aryl group, a substituted or unsubstituted alkenyl group, a substituted or unsubstituted aralkyl group, a substituted or unsubstituted piperidino group, or a group of the formula:

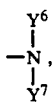

——$OY^8$ or —$SY^9$ in which $Y^6$ to $Y^9$ are independently a hydrogen atom, a substituted or unsubstituted alkyl group or a substituted or unsubstituted aryl group, provided that at least one of $Y^3$, $Y^4$ and $Y^5$ is a mono-, di- or tri-halogenated methyl group.

Further, the trifluoromethanesulfonic acid esters of the following formulas (5) to (8) may be used:

$$CF_3SO_2O\text{—}(CH_2)_n\text{—}Y_{10} \quad (5)$$

wherein $Y^{10}$ is a substituted or unsubstituted aryl group and n is 0 or 1;

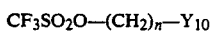

wherein $Y^{11}$ and $Y^{12}$ are independently a hydrogen atom, a substituted or unsubstituted aryl group, a substituted or unsubstituted alkyl group or a substituted or unsubstituted alkoxyl group, $Y^{13}$ is a substituted or unsubstituted aryl group, and n' is 1 or 2;

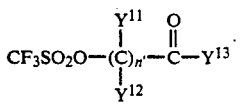

wherein $Y^{14}$ is a substituted or unsubstituted alkyl group and $Y^{15}$ is a substituted or unsubstituted aryl group;

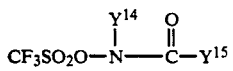

wherein $Y^{16}$ is a hydrogen atom, a substituted or unsubstituted aryl group or a substituted or unsubstituted alkyl group and $Y^{17}$ is a substituted or unsubstituted aryl group.

The compound (3) is commercially available or may be prepared by reacting sodium sulfinate or its derivative with pheacyl bromide or its derivative.

The alkyl group for $Y^1$ and $Y^2$ in the formula (3) is preferably a straight or branched $C_1\text{-}C_5$ alkyl group, in particular, a methyl group or an ethyl group. The alkenyl group is preferably a $C_2\text{-}C_6$ alkenyl group, and the alkoxyl group is preferably a $C_1\text{-}C_4$ alkoxyl group.

Specific examples of the compound (3) are

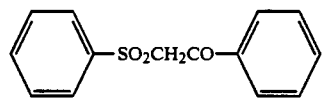

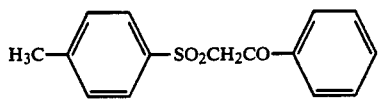

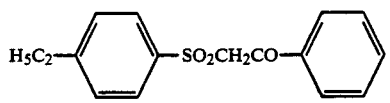

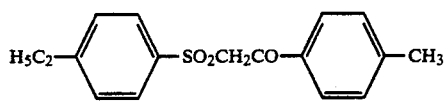

The compound (4) to be used as the photo-acid generator according to the present invention may be prepared by reacting a corresponding nitrile compound with aluminum bromide in the presence of hydrogen chloride or using a corresponding imidate according to the method described by Wakabayashi et al, Bull. Chem. Soc. Japan, 42, 2924 (1969), U.S. Pat. No. 3,987,037 or F. C. Schaefer et al, J. Org. Chem., 29 1527 (1964).

In the compound (4), at least two of $Y^3$, $Y^4$ and $Y^5$ are preferably trichloromethyl groups or tribromomethyl groups.

The alkyl group for $Y^3$, $Y^4$ and $Y^5$ is preferably a straight or branched $C_1\text{-}C_7$ alkyl group, in particular, a methyl group, an ethyl group, a n-propyl group, an isopropyl group, a n-butyl group, a tert.-butyl group, etc. A substituent on the alkyl group may be a halogen atom such as a chlorine atom or a bromine atom.

The aryl group for $Y^3$, $Y^4$ and $Y^5$ is preferably a mono- or di-cyclic one, in particular, a phenyl group or a naphthyl group. Examples of the substituent on the aryl group are a $C_1\text{-}C_7$ alkyl group (e.g. a methyl group, an ethyl group, a propyl group, a butyl group, etc.), a $C_1\text{-}C_7$ alkoxyl group (e.g. a methoxy group, an ethoxy group, a propoxy group, etc.), a halogen atom (e.g. a chlorine atom, a bromine atom, etc.), a cyano group, or a $C_1\text{-}C_7$-dialkylamino group (e.g. a dimethylamino group, a diethylamino group, etc.) and the like.

The alkenyl group for $Y^3$, $Y^4$ and $Y^5$ is preferably a straight or branched $C_2\text{-}C_7$ alkenyl group. Examples of the substituent on the alkenyl group are an aryl group (e.g. a phenyl group, a naphthyl group, etc.), a heterocyclic group (e.g. a benzoxazole group, a benzothiazole group, etc.) and the like. In addition, the aromatic or heterocyclic ring in the substituent may be further substituted with a halogen atom such as a chlorine atom or a bromine atom, a $C_1\text{-}C_7$ alkoxyl group, an acetyl group or a nitro group.

The alkyl group for $Y^6$ to $Y^9$ may be a straight or branched one. Preferably, each of $Y^6$ to $Y^9$ is a $C_1\text{-}C_6$ alkyl group, in particular, a methyl group, an ethyl group, a n-propyl group or a n-butyl group, or a phenyl group.

Specific examples of the compound (4) are the compounds described in the above literatures, for instance, 2-phenyl-4,6-bis(trichloromethyl)-s-triazine, 2-(p-acetylphenyl)-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2', 4'-dichlorophenyl)-4,6-bis(trichloromethyl)-s-triazine, 2,4,6-tris(trichloromethyl)-s-triazine, 2-methyl-4,6-bis(- trichloromethyl)-s-triazine, 2-(α,α,β-trichloroethyl)-4,6-bis(trichloromethyl)-s-triazine, 2-n-nonyl-4,6-bis(trichloromethyl)-s-triazine, 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, 2-methoxy-4-methyl-6-trichloromethyl-s-triazine and the like.

In addition, are exemplified the compounds described in GB Patent No. 1,388,492, for instance, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, 2-(p-methoxystyryl)-4-amino-6-trichloromethyl-s-triazine; the compounds described in Japanese Patent Kokai Publication No. 133428/1988, for instance, 2-(4-methoxynaphtho-1-yl)-4,6-bis(trichloromethyl)-s-triazine, 2-(4-ethoxynaphtho-1-yl)-4,6-bis(trichloromethyl)-s-triazine, 2-[4-(2-ethoxyethyl)naphtho-1-yl)-4,6-bis(trichloromethyl)-s-triazine, 2-(4,7-dimethoxynaphtho-1-yl)-4,6-bis(trichloromethyl)-s-triazine, 2-(acenaphtho-5-yl)-4,6-bis(trichloromethyl)-s-triazine, and the like.

Further, the compounds described in Japanese Patent Kokai Publication No. 153542/1988, for example,

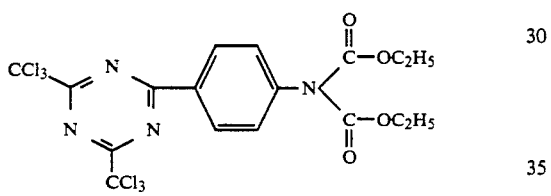

may be used.

The above exemplified compounds do not limit the scope of the present invention.

Among the above compounds, more preferred compounds are 2,5,6-tris(trichloromethyl)-s-triazine, 2-phenyl-4,6-bis(trichloromethyl)-s-triazine, 2-methyl-4,6-bis(trichloromethyl)-s-triazine, 2,4,6-tris(tribromomethyl)-s-triazine, 2-(p-acetylphenyl)-4,6-bis(trichloromethyl)-s-triazine, 2-(p-chlorophenyl)-4,6-bis(trichloromethyl)-s-triazine, 2-(p-methoxyphenyl)-4,6-bis(trichloromethyl)-s-triazine and the like.

The compound (5) or (6) may be prepared by reacting an alcohol or a phenol with trifluoromethanesulfonic acid anhydride or trifluoromethanesulfonyl chloride in the presence of a base such as pyridine, triethylamine or 4-dimethylaminopyridine.

The compound (7) may be prepared by reacting an aromatic amide with bromine in an alkaline condition to obtain a N-brominated compound and then reacting the N-brominated compound with sodium trifluoromethanesulfonate in a weakly acidic condition.

The compound (8) may be prepared by reacting an aromatic aldehyde with a hydroxylamine to obtain an oxime and then reacting the oxime with trifluoromethanesulfonic acid anhydride at a low temperature.

Specific examples of the compound having a trifluoromethanesulfonic acid ester group are as follows:

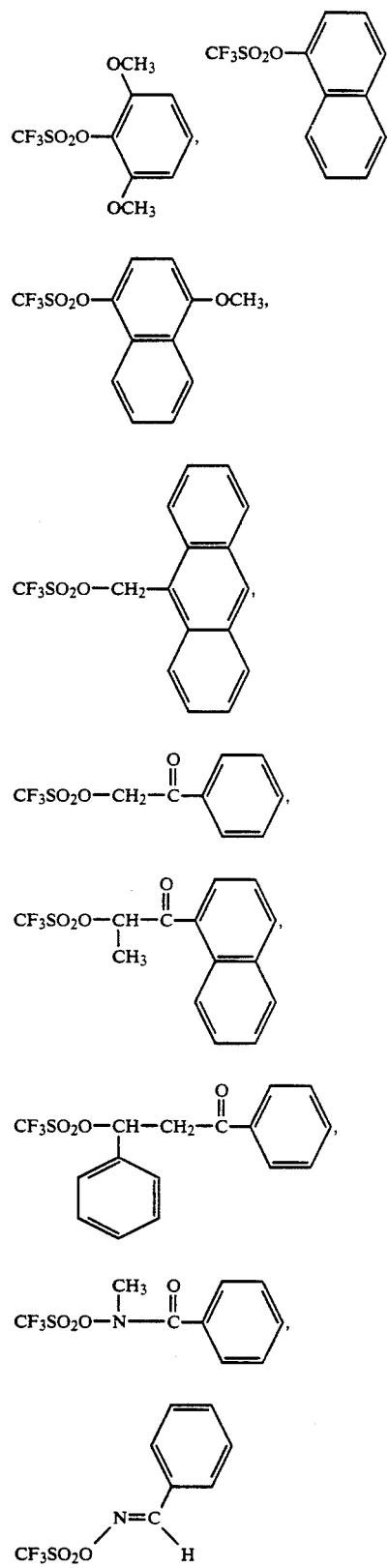

The compound having a trifluoromethanesulfonic acid ester group to be used in the present invention is not limited to the above exemplified compounds, and their analogues and derivatives may be used.

Among the photo-acid generators, the compound (4) is preferred in view of the sensitivity.

The photo-acid generators may be used independently or as a mixture of two or more of them.

When the compound having a trifluoromethanesulfonic acid ester group is used as the photo-acid generator, as the alkali-soluble resin, not only the resin obtained through the condensation reaction of the phenol compound containing the compound (1) with the aldehyde but also other alkali-soluble resin can be used. Examples of the other alkali-soluble resin are phenol-novolak resin prepared using, for example, phenol, cresol, xylenol, etc., vinylphenol resin, isopropenylphenol resin, a copolymer of vinylphenol with styrene, acrylonitrile, or methyl methacrylate or acrylate, a copolymer of isopropenylphenol with styrene, acrylonitrile, or methyl methacrylate or acrylate, or these resins or copolymer to which an alkyl group containing silicon is introduced. They may be used independently or as a mixture thereof.

The other alkali-soluble resin has a polystyrene-converted weight average molecular weight ($M_w$) of 1000 to 50,000, preferably 1500 to 30000, when it is measured by a gel permeation chromatography (GPC).

The cross linking agent may be the same as exemplified above in connection with the alkali-soluble resin which is obtained though the condensation reaction of the phenol compound containing the compound (1) with the aldehyde according to the present invention.

The negative photoresist composition according to the present invention may be prepared by mixing and dissolving the alkali-soluble resin, the cross linking agent and the photo-acid generator in a solvent.

The negative photoresist composition according to the present invention usually comprises 20 to 90% by weight of the alkali-soluble resin, 5 to 50% by weight of the cross linking agent and 0.1 to 20% by weight of the photo-acid generator, preferably 40 to 70% by weight of the alkali-soluble resin, 10 to 30% by weight of the cross linking agent and 1 to 10% by weight of the photo-acid generator.

When each of the compounds (4) to (8) is used as the photo-acid generator, the composition preferably comprises 40 to 95% by weight, preferably 60 to 90% by weight of the alkali-soluble resin, 3 to 50% by weight, preferably 5 to 25% by weight of the cross linking agent and 0.1 to 20% by weight, preferably 1 to 10% by weight of the photo-acid generator.

In general, a total amount of the alkali-soluble resin, the cross linking agent and the photo-acid generator is 1 to 100% by weight based on the weight of the solvent.

Examples of the solvent are ethylcellosolve acetate, methylcellosolve acetate, ethylcellosolve, methylcellosolve, propyleneglycol monomethyl ether acetate, propyleneglycol monoethyl ether acetate, butyl acetate, methyl isobutyl ketone, xylene, ethyl lactate, propyleneglycol monoethyl ether acetate, or mixtures thereof.

An amount of the solvent is from 30 to 80% by weight of the composition when ethylcellosolve acetate is used as the solvent.

The photoresist composition according to the present invention may optionally contain a conventional additive such as a small amount of a resin or a dye.

PREFERRED EMBODIMENTS OF THE INVENTION

The present invention will be illustrated by following Examples, which do not limit the scope of the present invention. In Examples, "parts" are by weight unless otherwise indicated.

SYNTHESIS EXAMPLE 1

In a 300 ml four-necked flask, the compound of the formula:

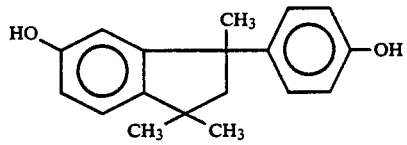

(p-OST Cyclic Dimer manufactured by Mitsui Toatsu) (53.6 g), ethylcellosolve acetate (50.4 g) and 5% oxalic acid (6.08 g) were charged and heated up to 80° C. Then, 37% formaline (13.0 g) was dropwise added to the mixture over 60 minutes while stirring, followed by further stirring at 110° C. for 10 hours.

Thereafter, the reaction mixture was neutralized, washed with water and dehydrated to obtain a solution of a novolak resin in ethylcellosolve acetate. This resin is referred to as "Resin A".

Resin A had a polystyrene-converted weight average molecular weight of 3000 measured by GPC.

SYNTHESIS EXAMPLE 2

In the same manner as in Synthesis Example 1 but using, in place of p-OST, a compound obtained by cyclizing m-isopropenylphenol in the presence of an acid catalyst, Resin B having a polystyrene-converted weight average molecular weight of 3000 was synthesized.

EXAMPLE 1

Resin A (9.33 parts), hexamethylolmelamine hexamethyl ether (3 parts) as a cross linking agent and α-phenylsulfonylacetophenone (1.5 parts) as a photo-acid generator were dissolved in ethylcellosolve acetate (45 parts). The formalated solution was filtered through a 0.2 μm polytetrafluoroethylene filter to obtain a resist solution.

The resist solution was coated with a spin coater on a silicon wafer which had been cleaned by a conventional method at a thickness of 0.8 μm.

The coated wafer was prebaked in an oven at 100° C. for 20 minutes, and the resist coating was exposed with deep ultraviolet through a chrome mask having a pattern by Canon Proximity Mask Aligner PLA-501F using a CM-250 mirror.

After exposure, the wafer was heated on a hot plate at 100° C. for 3 minutes to effect the cross linking of the exposed part and developed in a 2.0 wt. % aqueous solution of tetramethylammonium hydroxide to obtain a negative pattern. By plotting remaining film thicknesses against the exposure amounts, a sensitivity of 20 mJ/cm$^2$ (an exposure amount at the 50% film thickness retention rate) and a γ-value of 9.50 (a criteria for the resolution) were obtained.

EXAMPLE 2

In the same manner as in Example 1 but using tetramethylolbenzoguanamine tetramethyl ether as a cross linking agent, a negative pattern was formed. The sensitivity was 30 mJ/cm$^2$ and the γ-value was 8.50.

EXAMPLE 3

In the same manner as in Example 1 but using tetramethylolbenzoguanamine tetra-n-butyl ether as a cross linking agent, a negative pattern was formed. The sensitivity was 32 mJ/cm² and the γ-value was 8.30.

EXAMPLE 4

In the same manner as in Example 1 but using Resin B in place of Resin A, a negative pattern was formed. The results were as good as in Example 1.

EXAMPLE 5

In the same manner as in Example 2 but using Resin B in place of Resin A, a negative pattern was formed. The results were as good as in Example 1.

EXAMPLE 6

In the same manner as in Example 1 but using 2-(4-toluenesulfonyl)acetophenone in place of α-phenylsulfonyl-acetophenone, a negative pattern was formed. The sensitivity was 22 mJ/cm² and the γ-value was 8.95.

EXAMPLE 7

In the same manner as in Example 2 but using 2-(4-toluenesulfonyl)acetophenone in place of α-phenylsulfonylacetophenone, a negative pattern was formed. The sensitivity was 35 mJ/cm² and the γ-value of 8.10.

COMPARATIVE EXAMPLE 1

In the same manner as in Example 1 but using a conventional m- and p-cresol copolymerized novolak resin (a molar ratio of m-cresol to p-cresol of 4:6, a polystyrene-converted weight average molecular weight of 4000) in place of Resin A, a negative pattern was formed. The sensitivity was 40 mJ/cm² and the γ value was 5.18.

COMPARATIVE EXAMPLE 2

In the same manner as in Example 2 but using a conventional m- and p-cresol copolymerized novolak resin (a molar ratio of m-cresol to p-cresol of 4:6, a polystyrene-converted weight average molecular weight of 4000) in place of Resin A, a negative pattern was formed. The sensitivity was 50 mJ/cm² and the γ value of 4.2.

SYNTHESIS EXAMPLE 3

To methyl trichloroacetoimidate (25.0 g), glacial acetic acid (4.0 g) was dropwise added at room temperature over 30 minutes while stirring. After further stirring at room temperature for one hour, the mixture was heated up to 0° C. and kept at that temperature for 24 hours.

Then, the reaction mixture was poured in water (300 ml) and stirred to precipitate crystal, which was recovered by filtration and recrystallized from 85% ethanol to obtain 2,4,6-tris(trichloromethyl)-s-triazine.

EXAMPLE 8

Resin A (13.3 parts), hexamethylolmelamine hexamethyl ether (1.0 part) and 2,4,6-tris(trichloromethyl)-s-triazine prepared in Synthesis Example 3 (0.7 part) were dissolved in ethylcellosolve acetate (45 parts). The formulated solution was filtered through a 0.2 μm polytetrafluoroethylene filter to obtain a resist solution.

In the same manner as in Example 1, the resist solution was coated on the silicon wafer cleaned by the conventional method and exposed.

After exposure, the wafer was heated on a hot plate at 120° C. for one minute to effect the cross linking of the exposed part and developed in a 2.0 wt. % aqueous solution of tetramethylammonium hydroxide to obtain a negative pattern. By plotting remaining film thicknesses against the exposure amounts, a sensitivity of 5 mJ/cm² (254 nm) (an exposure amount at the 90% film thickness retention rate) was obtained.

The formed pattern was observed by an electron microscope to find that a minute pattern of 0.7 μm could be resolved.

EXAMPLE 9

In the same manner as in Example 8 but using 2,6-bis(-hydroxymethyl)-p-cresol (manufactured by Aldrich) in place of hexamethylolmelamine hexamethyl ether, a negative pattern was formed. The sensitivity was 15 mJ/cm² (254 nm). The minute pattern of 0.7 μm could be resolved.

EXAMPLE 10

In the same manner as in Example 8 but exposing the resist coating with a KrF excimer laser stepper having an exposing wavelength of 248 nm (NSR 1755 EX 8, NA=0.45, manufactured by Nicon), a negative pattern was formed. The sensitivity was 2.3 mJ/cm² (248 nm). The minute pattern of 0.5 μm could be resolved.

SYNTHESIS EXAMPLE 4

In pyridine (20 ml), 4-methoxy-1-naphthol (5.2 g) was dissolved, and trifluoromethanesulfonic acid anhydride (10.0 g) was dropwise added to the solution while cooling with ice, following by stirring at room temperature. The reaction mixture was diluted with water and then extracted with dichloromethane. The organic layer was successively washed with 10% hydrochloric acid, water, dilute aqueous solution of sodium bicarbonate and saturated aqueous solution of sodium chloride. After drying over anhydrous sodium sulfate, the solvent was distilled off, and the remaining residue was purified by silica gel chromatography to obtain a trifluoromethanesulfonate of the formula:

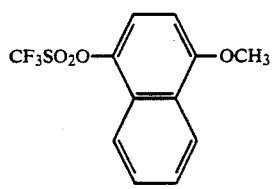

SYNTHESIS EXAMPLE 5

In the same manner as in Synthesis Example 4 but adding trifluoromethanesulfonyl chloride to 9-anthracene-methanol while cooling with ice, a trifluoromethanesulfonate of the formula:

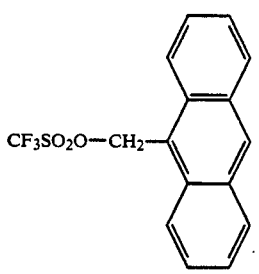

was obtained.

SYNTHESIS EXAMPLE 6

In the same manner as in Synthetic Example 4 but adding trifluoromethanesulfonyl chloride to 2-hydroxyacetophenone while cooling with ice, a trifluoromethanesulfonyl ester of the formula:

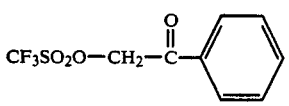

was obtained.

EXAMPLE 11

In the same manner as in Example 8 but using 1.0 parts of 4-methoxy-1-naphthyl trifluoromethanesulfonate obtained in Synthesis Example 4 as the photo-acid generator, the resist solution was prepared.

In the same manner as in Example 1, the resist solution was coated on the silicon wafer cleaned by the conventional method and exposed.

After exposure, the wafer was heated on a hot plate at 120° C. for one minute to effect the cross linking of the exposed part and developed in a 2.38 wt. % aqueous solution of tetramethylammonium hydroxide to obtain a negative pattern. By plotting remaining film thicknesses against the exposure amounts, a sensitivity of 5 mJ/cm² (254 nm) (an exposure amount at the 50% film thickness retention rate) was obtained.

The observation of the pattern by the electron microscope revealed that the pattern had good resolution.

EXAMPLE 12

In the same manner as in Example 11 but using 2,6-dimethoxyphenyl trifluoromethanesulfonate in place of 4-methoxy-1-naphthyl trifluoromethanesulfonate, the procedures were repeated. The sensitivity was 20 mJ/cm² (254 nm), and the resolution was good.

EXAMPLE 13

In the same manner as in Example 11 but using 9-anthracenemethyl trifluoromethanesulfonate obtained in Synthesis Example 5 in place of 4-methoxy-1-naphthyl trifluoromethanesulfonate, the procedures were repeated. The sensitivity was 4 mJ/cm² (254 nm), and the resolution was good.

EXAMPLE 14

In the same manner as in Example 11 but using phenacyl trifluoromethanesulfonate obtained in Synthesis Example 6 in place of 4-methoxy-1-naphthyl trifluoromethanesulfonate, the procedures were repeated. The sensitivity was 15 mJ/cm² (254 nm), and the resolution was good.

As explained above, the negative photoresist composition of the present invention has high sensitivity in the exposing range with far ultraviolet or the excimer laser beam. As the result, not only the resolution power of the resist is increased but also the resolution and the contrast are considerably increased in the lithography, so that the fine photoresist pattern with high accuracy can be formed.

What is claimed is:

1. A negative photoresist composition comprising an alkali-soluble resin obtainable through a condensation reaction of an aldehyde with a phenol compound containing a compound of the general formula:

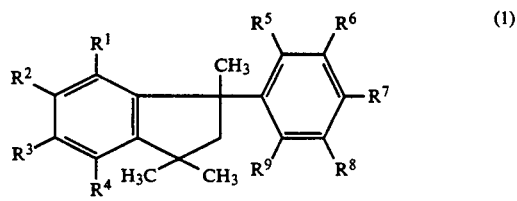

wherein $R^1$ to $R^9$ are independently a hydrogen atom, a substituted or unsubstituted alkyl group, a substituted or unsubstituted alkenyl group, a substituted or unsubstituted alkylcarbonyl group, a halogen atom or a hydroxyl group, provided that at least one of $R^1$ to $R^9$ is a hydroxyl group and, at the ortho- or para-position to said hydroxyl group, at least two hydrogen atoms are present; a cross linking agent; and a photo-acid generator.

2. The negative photoresist composition according to claim 1, wherein said cross linking agent is a compound of the formula:

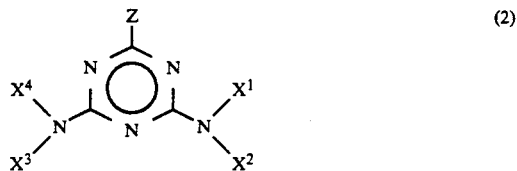

wherein Z is —NRR' or a substituted or unsubstituted aryl group, R, R' and $X^1$ to $X^4$ are independently a hydrogen atom or a group of the formula: —CH₂OH or —CH₂OR" in which R" is an alkyl group.

3. The negative photoresist composition according to claim 1, wherein said photo-acid generator is a compound of the formula:

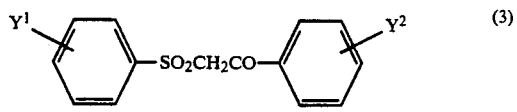

wherein $Y^1$ and $Y^2$ are independently a hydrogen atom, an alkyl group, an alkenyl group or an alkoxyl group.

4. The negative photoresist composition according to claim 1, wherein said photo-acid generator is a compound of the formula:

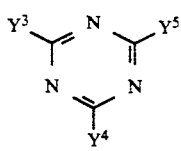 (4)

wherein $Y^3$, $Y^4$ and $Y^5$ are independently a substituted or unsubstituted alkyl group, a substituted or unsubstituted aryl group, a substituted or unsubstituted alkenyl group, a substituted or unsubstituted aralkyl group, a substituted or unsubstituted piperidino group, or a group of the formula:

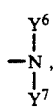

—$OY^8$ or —$SY^9$ in which $Y^6$ to $Y^9$ are independently a hydrogen atom, a substituted or unsubstituted alkyl group or a substituted or unsubstituted aryl group, provided that at least one of $Y^3$, $Y^4$ and $Y^5$ is a mono-, di- or tri-halogenated methyl group.

5. The negative photoresist composition according to claim 1, wherein said photo-acid generator is a compound having a trifluoromethanesulfonic acid ester group.

6. The negative photoresist composition according to claim 5, wherein said photo-acid generator is a compound of the formula:

$$CF_3SO_2O-(CH_2)_n-Y_{10} \quad (5)$$

wherein $Y^{10}$ is a substituted or unsubstituted aryl group and n is 0 or 1.

7. The negative photoresist composition according to claim 5, wherein said photo-acid generator is a compound of the formula:

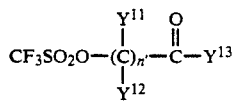 (6)

wherein $Y^{11}$ and $Y^{12}$ are independently a hydrogen atom, a substituted or unsubstituted aryl group, a substituted or unsubstituted alkyl group or a substituted or unsubstituted alkoxyl group, $Y^{13}$ is a substituted or unsubstituted aryl group, and n' is 1 or 2.

8. The negative photoresist composition according to claim 5, wherein said photo-acid generator is a compound of the formula:

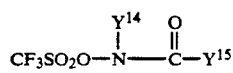 (7)

wherein $Y^{14}$ is a substituted or unsubstituted alkyl group and $Y^{15}$ is a substituted or unsubstituted aryl group.

9. The negative photoresist composition according to claim 5, wherein said photo-acid generator is a compound of the formula:

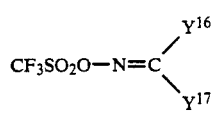 (8)

wherein $Y^{16}$ is a hydrogen atom, a substituted or unsubstituted aryl group or a substituted or unsubstituted alkyl group and $Y^{17}$ is a substituted or unsubstituted aryl group.

10. The negative photoresist composition of claim 1, wherein said phenol compound is

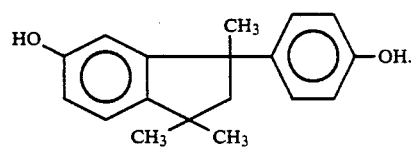

11. The negative photoresist composition of claim 1, wherein said phenol compound is a compound obtained by cyclizing m-isopropenylphenol in the presence of an acid catalyst.

12. A negative photoresist composition comprising an alkali-soluble resin obtained by condensation of an aldehyde with a phenol compound containing a compound of formula (1)

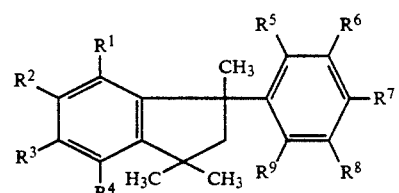 (1)

wherein $R^1$ to $R^9$ are independently a hydrogen atom, a substituted or unsubstituted alkyl group, a substituted or unsubstituted alkenyl group, a substituted or unsubstituted alkylcarbonyl group, a halogen atom or a hydroxyl group, provided that at least one of $R^1$ to $R^9$ is a hydroxyl group and, at the ortho- or para-position to said hydroxyl group, at least two hydrogen atoms are present; a cross linking agent; and a photo-acid generator having a trifluoromethanesulfonic acid ester group.

13. The negative photoresist composition of claim 12, which comprises 20 to 90% by weight of said alkali-soluble resin, 5 to 50% by weight of said cross linking agent and 0.1 to 20% by weight of said photo-acid generator.

14. The negative photoresist composition of claim 13 which comprises 40 to 70% by weight of said alkali-soluble resin, 10 to 30% by weight of said cross linking agent and 1-10% by weight of said photo-acid generator.

15. A negative photoresist composition comprising an alkali-soluble resin obtained by condensation of an aldehyde with a phenol compound containing a compound of formula (1)

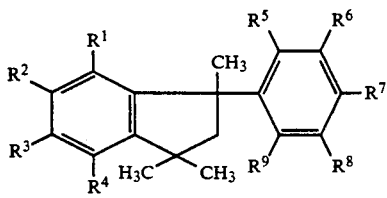

(1)

wherein $R^1$ to $R^9$ are independently a hydrogen atom, a substituted or unsubstituted alkyl group, a substituted or unsubstituted alkenyl group, a substituted or unsubstituted alkylcarbonyl group, a halogen atom or a hydroxyl group, provided that at least one of $R^1$ to $R^9$ is a hydroxyl group and, at the ortho- or para-position to said hydroxyl group, at least two hydrogen atoms are present; a cross linking agent; and a photo-acid generator having a trifluoromethanesulfonic acid ester group, further comprising at least one additional alkali-soluble resin selected from the group consisting of phenol-novolac resin; vinylphenol resin; isopropenylphenol resin; copolymers of vinylphenol with styrene, acrylonitrile, methyl methacrylate or acrylate; and these resins or copolymers to which an alkyl group containing silicon is introduced.

16. The negative photoresist composition of claim 15, wherein said additional alkali-soluble resin has a polystyrene-converted weight average molecular weight, $M_w$, of between 1000 and 50,000 as measured by gel permeation chromatography.

17. The negative photoresist composition of claim 16 wherein the $M_w$ of said additional alkali-soluble resin is between 1500 and 30,000.

18. A negative photoresist composition comprising an alkali-soluble resin obtained by condensation of an aldehyde with a phenol compound containing a compound of formula (1)

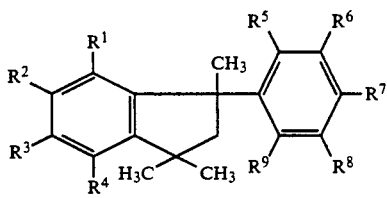

(1)

wherein $R^1$ to $R^9$ are independently a hydrogen atom, a substituted or unsubstituted alkyl group, a substituted or unsubstituted alkenyl group, a substituted or unsubstituted alkylcarbonyl group, a halogen atom or a hydroxyl group, provided that at least one of $R^1$ to $R^9$ is a hydroxyl group and, at the ortho- or para-position to said hydroxyl group, at least two hydrogen atoms are present; a cross linking agent; and a photo-acid generator selected from the group consisting of:

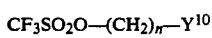 (5)

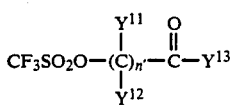 (6)

wherein $Y^{11}$ and $Y^{12}$ are independently a hydrogen atom, an aryl group, an alkyl group or an alkoxyl group, $Y^{13}$ is an aryl group, and n' is 1 or 2,

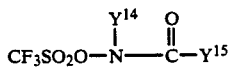 (7)

wherein $Y^{14}$ is an alkyl group and $Y^{15}$ is an aryl group, and

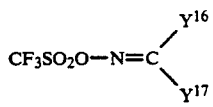 (8)

wherein $Y^{16}$ is a hydrogen atom, and aryl group or an alkyl group and $Y^{17}$ is an aryl group.

19. A negative photoresist composition comprising an alkali-soluble resin obtainable through a condensation reaction of an aldehyde with a phenol compound containing a compound of the general formula:

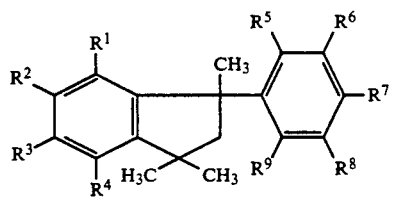

(1)

wherein $R^1$ to $R^9$ are independently a hydrogen atom, an alkyl group which may be substituted by a halogen atom or a lower alkylcarbonyl group, an alkenyl group which may be substituted by a halogen atom or an aryl group, an alkylcarbonyl group which may be substituted by a halogen atom or an aryl group, a halogen atom or a hydroxyl group, provided that at least one of $R^1$ to $R^9$ is a hydroxyl group and, at the ortho- or para-position to said hydroxyl group, at least two hydrogen atoms are present; a cross linking agent; and a photo-acid generator.

20. The negative photoresist composition according to claim 19, wherein said cross linking agent is a compound of the formula:

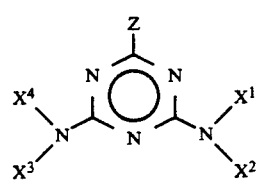

(2)

wherein Z is —NRR' or an aryl group which may be substituted by an alkyl group, an alkoxy group, a nitro group or a halogen atom, R, R' and $X^1$ to $X^4$ are independently a hydrogen atom or a group of the formula: —CH$_2$OH or —CH$_2$OR" in which R" is an alkyl group.

21. The negative photoresist composition according to claim 19, wherein said photo-acid generator is a compound of the formula:

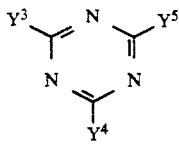

wherein $Y^3$, $Y^4$ and $Y^5$ are independently an alkyl group which may be substituted by a halogen atom, an aryl group which may be substituted by a $C_1$–$C_7$ alkyl group, a $C_1$–$C_7$ alkoxy group, a halogen atom, a cyano group or a $C_1$–$C_7$ dialkylamino group, an alkenyl group which may be substituted by an aryl group or a heterocyclic group, wherein said aryl or heterocyclic groups may be further substituted by a halogen atom, a $C_1$–$C_7$ alkoxy group, an acetyl group or a nitro group, an aralkyl group, a piperidino group, or a group of the formula:

—$OY^8$ or —$SY^9$ in which $Y^6$ to $Y^9$ are independently a hydrogen atom, an alkyl group or an aryl group, provided that at least one of $Y^3$, $Y^4$ and $Y^5$ is a mono-, di- or tri-halogenated methyl group.

* * * * *